United States Patent
Tsukihara et al.

(10) Patent No.: US 10,016,813 B2
(45) Date of Patent: Jul. 10, 2018

(54) SURFACE-COATED BORON NITRIDE SINTERED BODY TOOL

(71) Applicant: SUMITOMO ELECTRIC HARDMETAL CORP., Itami-shi (JP)

(72) Inventors: Nozomi Tsukihara, Itami (JP); Katsumi Okamura, Itami (JP); Makoto Setoyama, Itami (JP)

(73) Assignee: SUMITOMO ELECTRIC HARDMETAL CORP., Itami-shi (JP)

( * ) Notice: Subject to any disclaimer, the term of this patent is extended or adjusted under 35 U.S.C. 154(b) by 59 days.

(21) Appl. No.: 14/893,445

(22) PCT Filed: Jun. 5, 2014

(86) PCT No.: PCT/JP2014/064956
§ 371 (c)(1),
(2) Date: Nov. 23, 2015

(87) PCT Pub. No.: WO2015/001902
PCT Pub. Date: Jan. 8, 2015

(65) Prior Publication Data
US 2016/0114400 A1 Apr. 28, 2016

(30) Foreign Application Priority Data
Jul. 3, 2013 (JP) .................................. 2013-139796

(51) Int. Cl.
*B23B 27/14* (2006.01)
*C23C 14/06* (2006.01)
(Continued)

(52) U.S. Cl.
CPC ........ *B23B 27/148* (2013.01); *C04B 35/5831* (2013.01); *C04B 41/009* (2013.01);
(Continued)

(58) Field of Classification Search
USPC .......... 51/307, 309; 428/216, 336, 697, 698, 428/699, 704
See application file for complete search history.

(56) References Cited

U.S. PATENT DOCUMENTS

| | | | | |
|---|---|---|---|---|
| 4,311,490 A | * | 1/1982 | Bovenkerk | B01J 3/062 51/307 |
| 5,330,853 A | * | 7/1994 | Hofmann | C23C 14/0084 428/697 |

(Continued)

FOREIGN PATENT DOCUMENTS

| | | |
|---|---|---|
| CN | 101678466 A | 3/2010 |
| CN | 102666437 A | 9/2012 |

(Continued)

OTHER PUBLICATIONS

Notification of the First Office Action in counterpart Chinese Patent Application No. 201480031255.2, dated Sep. 7, 2016.

(Continued)

*Primary Examiner* — Archene Turner
(74) *Attorney, Agent, or Firm* — Venable LLP; Michael A. Sartori; Kerri M. Patterson

(57) ABSTRACT

A surface-coated boron nitride sintered body tool is provided, in which at least a cutting edge portion includes a cubic boron nitride sintered body and a coating film formed on a surface of the cubic boron nitride sintered body. The coating film contains Si and includes a B layer formed by alternately stacking one or more of each of a B1 compound layer and a B2 compound layer that are different in composition. A ratio between an average thickness t1 of the B1 compound layers and an average thickness t2 of the B2 compound layers is defined as t2/t1 that satisfies a relation of $0.5 < t2/t1 \le 10$.

17 Claims, 2 Drawing Sheets

(51) Int. Cl.

| | | |
|---|---|---|
| *C23C 14/02* | (2006.01) | |
| *C23C 28/04* | (2006.01) | |
| *C23C 28/00* | (2006.01) | |
| *C23C 30/00* | (2006.01) | |
| *C04B 41/89* | (2006.01) | |
| *C04B 41/00* | (2006.01) | |
| *C04B 41/52* | (2006.01) | |
| *C04B 35/5831* | (2006.01) | |

(52) U.S. Cl.
CPC ............ *C04B 41/52* (2013.01); *C04B 41/89* (2013.01); *C23C 14/022* (2013.01); *C23C 14/0641* (2013.01); *C23C 14/0664* (2013.01); *C23C 28/044* (2013.01); *C23C 28/42* (2013.01); *C23C 30/005* (2013.01); *B23B 2222/28* (2013.01); *B23B 2226/125* (2013.01); *B23B 2228/105* (2013.01)

(56) References Cited

U.S. PATENT DOCUMENTS

| | | | |
|---|---|---|---|
| 6,599,062 B1 | 7/2003 | Oles et al. | |
| 7,901,796 B2* | 3/2011 | Fukui | B23P 15/28 |
| | | | 428/698 |
| 8,119,227 B2* | 2/2012 | Reineck | C23C 30/005 |
| | | | 428/699 |
| 2006/0222893 A1 | 10/2006 | Derflinger | |
| 2007/0275268 A1* | 11/2007 | Takaoka | C22C 26/00 |
| | | | 428/698 |
| 2010/0215951 A1 | 8/2010 | Shibata et al. | |
| 2012/0090247 A1 | 4/2012 | Miura | |
| 2012/0114437 A1* | 5/2012 | Andersson | C04B 41/009 |
| | | | 407/119 |
| 2012/0282050 A1 | 11/2012 | Setoyama et al. | |
| 2013/0034712 A1 | 2/2013 | Kudoh et al. | |
| 2013/0108850 A1 | 5/2013 | Kudo et al. | |

FOREIGN PATENT DOCUMENTS

| | | |
|---|---|---|
| EP | 1736307 A1 | 12/2006 |
| EP | 1842610 A1 | 10/2007 |
| EP | 2156912 A1 | 2/2010 |
| EP | 2591869 A1 | 5/2013 |
| JP | H08-134629 A | 5/1996 |
| JP | 2008-188689 A | 8/2008 |
| JP | 2008-534297 A | 8/2008 |
| JP | 2008-254159 A | 10/2008 |
| WO | 01/36711 A1 | 5/2001 |
| WO | WO-2010/150335 A1 | 12/2010 |
| WO | WO-2011/129422 A1 | 10/2011 |
| WO | WO-2012/005275 A1 | 1/2012 |

OTHER PUBLICATIONS

International Search Report in PCT International Application No. PCT/JP2014/064956 dated Sep. 9, 2014.
International Preliminary Report on Patentability in PCT International Application No. PCT/JP2014/064956 dated Mar. 31, 2015.
Extended European Search Report in counterpart European Patent Application No. 14820479.5, dated Jan. 31, 2017.

* cited by examiner

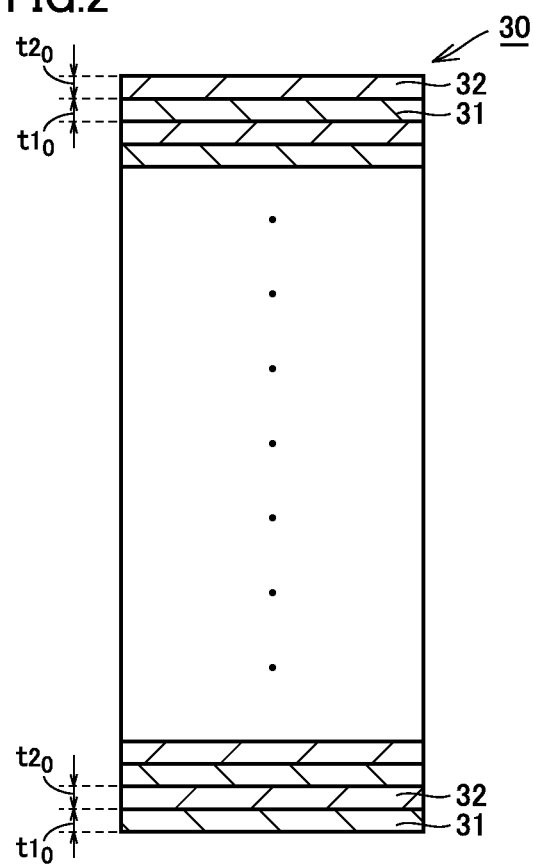

SURFACE-COATED BORON NITRIDE SINTERED BODY TOOL

TECHNICAL FIELD

The present invention relates to a surface-coated boron nitride sintered tool, in which at least a cutting edge portion includes a cubic boron nitride (hereinafter also referred to as "cBN") sintered body and a coating film formed on the cBN sintered body.

BACKGROUND ART

There is a cutting tool formed of a cBN sintered body as a base member having a surface on which a coating film made of ceramics or the like is formed (which will be hereinafter also referred to as a "coated cBN tool"). This cutting tool exhibits excellent wear resistance, and therefore, is used for cutting processing of hardened steel.

As such a cutting tool, for example, WO2010/150335 (PTD 1) and WO2012/005275 (PTD 2) each disclose a tool formed of a cBN sintered body having a surface coated with a coating film including a lower layer formed of multiple layers having specific ceramic compositions and an upper layer formed of a compound layer.

Furthermore, a base member of a tool having a coating film is formed not only of a cBN sintered body, for example, but also of cemented carbide and the like (Japanese Patent Laying-Open No. 2008-188689 (PTD 3) and Japanese Patent National Publication No. 2008-534297 (PTD 4)).

CITATION LIST

Patent Document

PTD 1: WO2010/150335
PTD 2: WO2012/005275
PTD 3: Japanese Patent Laying-Open No. 2008-188689
PTD 4: Japanese Patent National Publication No. 2008-534297

SUMMARY OF INVENTION

Technical Problem

Recently, cutting processing is requiring extremely high precision. The precision required in this case is that a work material after processing exhibits excellent surface roughness to such an extent that finish processing such as polishing is not required after the cutting processing. In other words, cutting processing is required to also provide finish processing, unlike the conventional technique. Therefore, the cutting distance, at which prescribed surface roughness can be maintained (which will be hereinafter also referred to as a "surface roughness life"), is recently regarded as an essential feature for determining the tool performance. The conventional cutting tool, however, has not yet come to have a surface roughness life that can sufficiently satisfy the current users. Therefore, the surface roughness life is often simply regarded as a tool life under the current circumstances, and it is strongly desired to increase the surface roughness life.

Various factors that exert influences upon the surface roughness of the work material may be conceivable. Among others, the shape change of the insert resulting from wear is considered as a particularly influential factor. Accordingly, improving the wear resistance is considered as effective for increasing the surface roughness life.

Until now, there have been developed cutting tools with wear resistance improved by forming a coating film containing Si on the surface of the base member. For example, there is a cutting tool formed of a base member made of cemented carbide having a surface on which a coating film containing Si is formed. It is known that this cutting tool exhibits suitable wear resistance in steel processing.

In high precision processing of hardened steel higher in hardness than steel, however, sufficient surface roughness life could not be obtained even if a coating film containing Si was formed, similarly to cemented carbide, on the surface of the base member made of a cBN sintered body. Thus, in the present circumstances, there has not yet been developed a cutting tool implementing a sufficient surface roughness life in high precision processing of hardened steel.

The present invention has been made in light of the above-described circumstances. An object of the present invention is to provide a coated cBN tool implementing high dimensional precision and having an excellent tool life in processing of a hard material such as hardened steel.

Solution to Problem

In order to solve the above-described problems, the present inventors have processed hardened steel using a cBN tool having a surface on which multiple layers containing Si were formed, and they also carried out detailed analysis of the damaged state of the tool. The results showed that, in addition to normal crater wear and flank face wear, boundary wear also occurred in the front boundary portion corresponding to one end of the wear portion. Also, the present inventors found that this boundary wear exerted the most significant influence upon the surface roughness life.

In addition to the above, the present inventors have conducted repeated studies based on their findings described above. As a result, they also found that the most effective way to suppress boundary wear was to form a coating film from multiple layers having specific compositions, and stack these multiple layers so as to achieve a layer thickness ratio in a specific relation. Consequently, the present inventors have completed the present invention.

Specifically, the surface-coated boron nitride sintered body tool of the present invention has configurations (1) to (9) described below.

(1) A surface-coated boron nitride sintered body tool is provided, in which at least a cutting edge portion includes a cubic boron nitride sintered body and a coating film formed on a surface of the cubic boron nitride sintered body.

(2) The cubic boron nitride sintered body includes 30 vol % or more and 80 vol % or less of cubic boron nitride particles, and further includes a binder phase including: at least one compound selected from the group consisting of nitride, carbide, boride, oxide, and solid solutions thereof in group 4 elements, group 5 elements and group 6 elements in a periodic table; an aluminum compound; and inevitable impurities.

(3) The coating film includes an A layer and a B layer.

(4) The A layer includes $MLa_{za1}$ (M represents one or more of group 4 elements, group 5 elements and group 6 elements in the periodic table, Al and Si; La represents one or more of B, C, N, and O; and za1 is 0.85 or more and 1.0 or less).

(5) The B layer is formed by alternately stacking one or more of each of two or more compound layers having different compositions, and the compound layers each have a thickness of 30 nm or more and 300 nm or less.

(6) A B1 compound layer that is one of the above-described compound layers includes $(Ti_{1-xb1-yb1}Si_{xb1}M1_{yb1})(C_{1-zb1}N_{zb1})$ (M1 represents one or more of group 4 elements except for Ti, group 5 elements and group 6 elements in the periodic table, and Al; xb1 is 0.01 or more and 0.25 or less; yb1 is 0 or more and 0.7 or less; and zb1 is 0.4 or more and 1 or less).

(7) A B2 compound layer that is one of the above-described compound layers and different from the B1 compound layer includes $(Al_{1-xb2}M2_{xb2})(C_{1-zb2}N_{zb2})$ (M2 represents one or more of group 4 elements, group 5 elements and group 6 elements in the periodic table, and Si; xb2 is 0.2 or more and 0.7 or less; and zb2 is 0.4 or more and 1 or less).

(8) t2/t1 that is a ratio between an average thickness t1 of the B1 compound layers and an average thickness t2 of the B2 compound layers satisfies a relation of $0.5 < t2/t1 \leq 10.0$.

(9) The A layer has a thickness of 0.2 μm or more and 10 μm or less, the B layer has a thickness of 0.1 μm or more and 5 μm or less, and the coating film has an entire thickness of 0.5 μm or more and 15 μm or less.

Advantageous Effects of Invention

The surface-coated boron nitride sintered body tool of the present invention implements high dimensional precision and exhibits an excellent tool life in processing of a hard material such as hardened steel.

BRIEF DESCRIPTION OF DRAWINGS

FIG. 2 is a cross-sectional view showing an example of the configuration of a main part of the surface-coated boron nitride sintered body tool according to the present embodiment.

DESCRIPTION OF EMBODIMENTS

Figure 1:
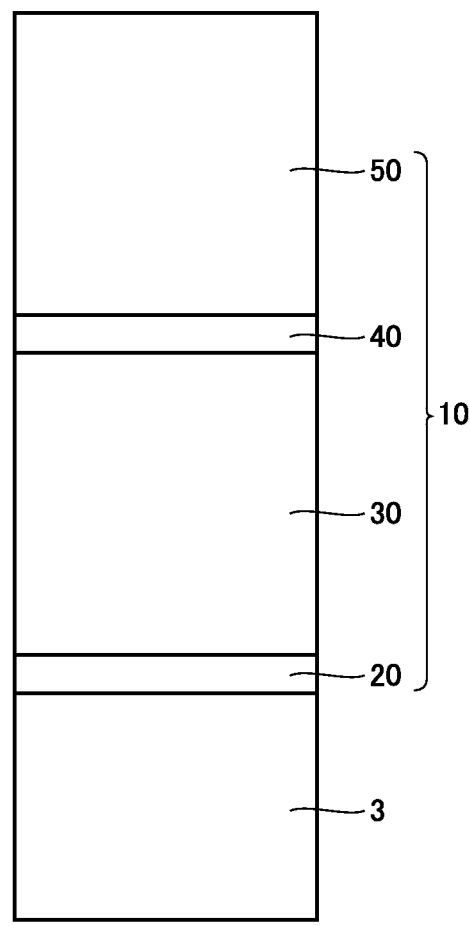
FIG. 1 is a cross-sectional view showing an example of the configuration of a surface-coated boron nitride sintered body tool according to the present embodiment.

The embodiments according to the present invention will be hereinafter described in greater detail. While the following explanation will be made with reference to the accompanying drawings, the same or corresponding components are designated by the same reference characters in the accompanying drawings of the present application.

<<Surface-Coated Boron Nitride Sintered Body Tool>>

In a coated cBN tool of the present embodiment, at least a cutting edge portion includes a cBN sintered body and a coating film formed on the surface of the cBN sintered body. As described later, the coating film is formed of an A layer that is excellent in crater wear resistance and a B layer that is excellent in boundary wear resistance, thereby achieving an excellent effect that high dimensional precision can be maintained for a long time when processing a sintered alloy, hard-to-cut cast iron, hardened steel and the like, that is, the surface roughness life is relatively long. Also, particularly for light interrupted cutting, the coated cBN tool of the present embodiment can exhibit a remarkably long surface roughness life as compared with the conventional cutting tool.

It is considered that boundary wear during light interrupted cutting progresses as in the following manner. (a) Cracking appears in the surface of the coating film by repeated impacts. (b) Cracking extends through the coating film and then reaches a cBN sintered body. (c) Oxygen infiltrates into the coating film through this cracking, and damage progresses from the coating film deeply to the cBN sintered body.

It is specifically unclear in what mechanism the coated cBN tool of the present embodiment exhibits an excellent surface roughness life in light interrupted cutting. As a reason therefor, the present inventors estimate that the B layer is formed of multiple layers containing Si, and each of these multiple layers is stacked so as to achieve a specific layer thickness ratio, so that progress of cracking and infiltration of oxygen can be suppressed. Each of components forming the coated cBN tool of the present embodiment will be hereinafter described.

<cBN Sintered Body>

A cBN sintered body of the present embodiment forms a base member for a coated cBN tool in a cutting edge portion of the tool, includes 30 vol % or more and 80 vol % or less of cBN particles, and further includes a binder phase as the remainder.

In this case, the binder phase includes: at least one compound selected from the group consisting of nitride, carbide, boride, oxide, and solid solutions thereof in group 4 elements, group 5 elements, and group 6 elements in the periodic table; an aluminum compound; and inevitable impurities. The binder phase binds the cBN particles to each other in the sintered body structure. As 30 vol % or more of cBN particles are contained, a decrease in wear resistance of the cBN sintered body forming the base member can be prevented. Furthermore, as 80 vol % or less of cBN particles are contained, the cBN particles that are excellent in strength and toughness serve as a skeletal structure in the sintered body structure, so that the fracture resistance of the cBN sintered body can be ensured.

In the present specification, the volume content of the cBN particles is to be measured by the method described below. Specifically, a cBN sintered body is mirror-polished, and the backscattered electron image of the cBN sintered body structure in an arbitrary region is observed by using an electron microscope at 2000 times magnification. In this case, the cBN particles are observed as a black area while the binder phase is observed as a gray area or a white area. In an observation view image, the cBN particle region and the binder phase region are binarized by image processing to measure the occupancy area of the cBN particle region. Then, the occupancy area is substituted into the following equation, thereby calculating the volume content of the cBN particles.

(Volume content of cBN particles)=(occupancy area of cBN particles)÷(area of cBN sintered body structure in view image)×100.

It is preferable that the volume content of the cBN particles is 50 vol % or more and 65 vol % or less. As the volume content of the cBN particles is 50 vol % or more, the coated cBN tool tends to exhibit an excellent balance between the wear resistance and the fracture resistance. Furthermore, as the volume content of the cBN particles is 65 vol % or less, the binder phase is to be distributed appropriately, so that the bonding strength of the cBN particles by the binder phase tends to increase.

Furthermore, it is preferable that the cBN particles are shaped to protrude more to the coating film than to the binder phase at the interface between the cBN sintered body and the coating film. Thereby, the adhesiveness between the cBN sintered body and the coating film can be improved. Furthermore, it is preferable that the difference in level between the cBN particles and the binder phase is 0.05 μm or more and 1.0 μm or less. As the difference in level is 0.05 μm or more, an anchor effect can be achieved. Furthermore, as the difference in level is 1.0 μm or less, the cBN particles can be effectively prevented from falling off from the sintered body. In this case, the difference in level is more preferably 0.1 μm or more and 0.5 μm or less. If the difference in level falls within this range, the anchor effect and the fall-off preventing effect described above can be further improved. In the present specification, the difference in level is to be measured by the same method as the method of measuring the thickness and the like of the entire coating film, which will be described later.

Furthermore, it is preferable that the cBN particles in the cBN sintered body are increased in volume content from the interface between the cBN sintered body and the coating film toward the inside of the cBN sintered body. By such a configuration, the volume content of the binder phase is higher at the interface between the cBN sintered body and the coating film than that of the cBN particles, so that the adhesiveness between the cBN sintered body and the coating film can be improved. In contrast, on the inside of the cBN sintered body, the volume content of the cBN particles is higher than that of the binder phase, so that the fracture resistance of the cBN sintered body can be improved. For example, the volume content of the cBN particles can be set at 40 vol % in an area close to the interface with the coating film (that is, in the region located at a distance of 0 μm or more and 20 μm or less from the interface between the cBN sintered body and the coating film toward the cBN sintered body-side), and can be set at 60 vol % near the center of the cBN sintered body in the thickness direction (that is, in the region located at a distance of more than 20 μm and 100 μm or less from the interface between the cBN sintered body and the coating film toward the inside of the cBN sintered body).

Furthermore, it is preferable that the cBN particles are increased in particle size from the interface between the cBN sintered body and the coating film toward the inside of the cBN sintered body. In such a configuration, the particle size of each cBN particle is relatively small at the interface between the cBN sintered body and the coating film, so that the adhesiveness between the cBN sintered body and the coating film can be improved. On the other hand, since the particle size of each cBN particle is relatively large on the inside of the cBN sintered body, the toughness can be improved. For example, the particle size of each cBN particle can be set at 0.1 μm or more and 1 μm or less in the region located at a distance of 0 μm or more and 20 μm or less from the interface between the cBN sintered body and the coating film toward the inside of the cBN sintered body, and can be set at 2 μm or more and 10 μm or less in the region located at a distance of more than 20 μm and 300 μm or less from the interface between the cBN sintered body and the coating film toward the inside of the cBN sintered body.

In the present specification, the particle size of each cBN particle is to be measured by the following method. Specifically, the diameter of the circle circumscribing the cBN particle (that is, a circumscribed circle equivalent diameter) is measured in the backscattered electron image of the cBN sintered body structure obtained when the volume content of the cBN particles is calculated. Then, this diameter is defined as a particle size of the cBN particle.

Furthermore, in the present embodiment, the cBN sintered body only has to be provided in the cutting edge portion of the coated cBN tool. In other words, the base member of the coated cBN tool may include a cutting edge portion formed of a cBN sintered body, and a base member main body made of a material different from that of the cBN sintered body (for example, cemented carbide). In this case, it is preferable that the cutting edge portion formed of a cBN sintered body is bonded to the base member main body with a braze material and the like. The braze material may be selected as appropriate in consideration of the bonding strength and the melting point. In addition, the cBN sintered body may form the entire base member of the coated cBN tool.

<Coating Film>

The coating film of the present embodiment includes an A layer and a B layer. In the present embodiment, the coating film can include any layers other than these A and B layers as long as it includes these A and B layers. Even if the coating film includes other layers, the effect of the present invention can be achieved. In this case, other layers may for example be: a C layer provided between the A layer and the B layer described later; a D layer as the lowermost layer; and the like. It is to be noted that other layers are not limited to those described above and do not deviate from the scope of the present invention even if layers other than those described above are included.

In the present embodiment, the thickness of the entire coating film is 0.5 μm or more and 15 μm or less. As the thickness of the coating film is 0.5 μm or more, it becomes possible to prevent a decrease in wear resistance of the coated cBN tool resulting from a thin coating film. Furthermore, as the thickness of the entire coating film is 15 μm or less, the chipping resistance of the coating film in the early stage of cutting can be improved. The thickness of the entire coating film is more preferably 1.5 μm or more and 15 μm or less.

In the present specification, each thickness of the coating film and each layer described later, and the number of stacked layers were measured by observing a cross section, which was obtained by cutting the coated cBN tool, with a scanning electron microscope (SEM) or a transmission electron microscope (TEM). Furthermore, the composition of each of layers forming a coating film was measured by an energy dispersive X-ray spectroscopy (EDX) attached to the SEM or the TEM. In this case, the sample for cross-section observation can be produced, for example, using a focused ion beam system (FIB), a cross section polisher (CP), and the like.

Also, in the present embodiment, the coating film needs to be provided only in the cutting edge portion of the coated cBN tool, and does not need to be provided in a part of the portion different from the cutting edge portion or may cover the entire surface of the base member of the coated cBN tool. Also, the stacking configuration in a part of the coating film may be partially different in a portion different from the cutting edge.

<A Layer>

In the present embodiment, the A layer includes $MLa_{za1}$ (M represents one or more of group 4 elements, group 5 elements and group 6 elements in the periodic table, Al and Si; La represents one or more of B, C, N, and O; and za1 is 0.85 or more and 1.0 or less). Thereby, the A layer smoothly wears out during cutting processing. In other words, the A layer can wear out without undergoing peeling, cracking, chipping, or the like. Therefore, the crater wear resistance, the flank face wear resistance or the like of the coated cBN tool can be improved.

It is more preferable that the above-described A layer includes $(Ti_{1-xa}Ma_{xa})(C_{1-za2}N_{za2})$ (Ma represents one or more of group 4 elements except for Ti, group 5 elements and group 6 elements in the periodic table, Al and Si; xa is 0 or more and 0.7 or less; and za2 is 0 or more and 1 or less).

In this way, the A layer containing Ti can further effectively prevent peeling, cracking, chipping or the like in the A layer when wear occurs. In this case, it is more preferable that the above-mentioned xa is 0 or more and 0.3 or less. As xa falls within this range, the above-described effect can be further more improved. In the case where the A layer includes $(Ti_{1-xa(1)-xa(2)}Ma(1)_{xa(1)}Ma(2)_{xa(2)})(C_{1-za2}N_{za2})$, the sum of xa(1) and xa(2) is preferably 0 or more and 0.7 or less, and more preferably 0 or more and 0.3 or less. This also similarly applies to the B layer, the C layer and the D layer which will be described later.

According to the present embodiment, in the A layer, it is preferable that the composition (za2) of N described above changes in a step-like manner or in a slope-like manner from the cBN sintered body-side toward the surface-side of the A layer. For example, in the case where the composition of N is relatively large on the cBN sintered body-side of the A layer, the fracture resistance and the peeling resistance tends to increase. Furthermore, for example, in the case where the composition of N is relatively small on the surface-side of the A layer, peeling, cracking, chipping or the like of the A layer during wearing can be prevented. In this case, the expression that "the composition of N changes in a step-like manner from the cBN sintered body-side toward the surface-side of the A layer" means that the composition of N discontinuously decreases or increases from the cBN sintered body-side toward the surface-side of the A layer, for example, which is a configuration in which the composition of N is obtained by stacking two or more different layers. Furthermore, the expression that "the composition of N changes in a slope-like manner from the cBN sintered body-side toward the surface-side of the A layer" means that the composition of N continuously decreases or increases from the cBN sintered body-side toward the surface-side of the A layer, for example, which is a configuration obtained by continuously changing the flow rate ratio between raw material gas of N and raw material gas of C when the A layer is formed by the arc ion plating method.

Furthermore, it is preferable that the A layer is provided on its surface-side with a region where the composition of C is larger than that on its cBN sintered body-side. Thereby, the fracture resistance and the peeling resistance increase on the cBN sintered body-side of the A layer while peeling, cracking, chipping or the like of the A layer during wearing can be effectively prevented on the surface-side of the A layer. In this case, the cBN sintered body-side of the A layer means a region located at a distance of 0 μm or more and 0.1 μm or less from the surface of the A layer located closest to the cBN sintered body toward the inside of the A layer. Furthermore, the surface-side of the A layer shows a portion of the A layer that is different from its cBN sintered body-side.

The thickness of the A layer in the present embodiment is 0.2 μm or more and 10 μm or less. As the thickness of the A layer is 0.2 μm or more, the crater wear resistance, the flank face wear resistance or the like of the coated cBN tool tends to increase. If the thickness of the A layer exceeds 10 μm, it may be difficult to improve the crater wear resistance, the flank face wear resistance or the like. Therefore, the thickness of the A layer needs to be 10 μm or less. The thickness of the A layer is more preferably 1 μm or more and 3 μm or less.

Furthermore, in the present embodiment, it is preferable that the A layer is provided closer to the surface-side of the coated cBN tool than the B layer described later. Thereby, the A layer smoothly wears out so that occurrence of cracking can be suppressed. Furthermore, even if cracking occurs, the B layer can prevent this cracking from spreading to the base member-side.

<B Layer>

In the present embodiment, the B layer is formed by alternately stacking one or more of each of two or more compound layers having different compositions. The following shows a configuration obtained by alternately stacking one or more of each of a B1 compound layer and a B2 compound layer. As long as the B layer in the present embodiment includes a B1 compound layer and a B2 compound layer, the effects of the present invention can be achieved even if this B layer includes layers other than the B1 compound layer and the B2 compound layer. In addition, the thickness of the B layer is 0.1 μm or more and 5 μm or less.

<B1 Compound Layer>

The B1 compound layer forming a B layer includes $(Ti_{1-xb1-yb1}Si_{xb1}M1_{yb1})(C_{1-zb1}N_{zb1})$ (M1 represents one or more of group 4 elements except for Ti, group 5 elements and group 6 elements in the periodic table, and Al; xb1 is 0.01 or more and 0.25 or less; yb1 is 0 or more and 0.7 or less; and zb1 is 0.4 or more and 1 or less). In this case, the thickness of the B1 compound layer is 30 nm or more and 300 nm or less, more preferably 40 nm or more and 200 nm or less, and particularly preferably 50 nm or more and 150 nm or less.

<B2 Compound Layer>

The B2 compound layer forming a B layer together with the B1 compound layer includes $(Al_{1-xb2}M2_{xb2})(C_{1-zb2}N_{zb2})$ (M2 represents one or more of group 4 elements, group 5 elements and group 6 elements in the periodic table, and Si; xb2 is 0.2 or more and 0.7 or less; and zb2 is 0.4 or more and 1 or less). In this case, it is preferable that M2 represents at least one of Ti and Cr. As the B2 compound layer includes Al and at least one of Ti and Cr, the B2 compound layer can be provided with a function as a layer with high toughness, which has both of wear resistance and heat resistance.

Furthermore, a composition xb2 of M2 is preferably 0.25 or more and 0.5 or less, and more preferably 0.25 or more and 0.4 or less. Furthermore, the thickness of the B2 compound layer is 30 nm or more and 300 nm or less, more preferably 40 nm or more and 200 nm or less, and particularly preferably 50 nm or more and 150 nm or less.

In addition, the lowermost layer of the B layer may be a B1 compound layer or a B2 compound layer. Furthermore, the uppermost layer of the B layer may be a B1 compound layer or a B2 compound layer.

In the present embodiment, the ratio between an average thickness t1 of the B1 compound layers and an average thickness t2 of the B2 compound layers is defined as t2/t1, which satisfies the relation of 0.5<t2/t1≤10.0. In the present specification, average thickness t1 of the B1 compound layers is calculated using the following calculation formula (the same applies to average thickness t2 of the B2 compound layers).

(Average thickness $t1$ of $B1$ compound layers)=(total thickness of $B1$ compound layers)÷(the number of $B1$ compound layers).

Furthermore, in the case where it is difficult to measure the thickness of the B1 compound layer, average thickness t1 of the B1 compound layers can be calculated using the following calculation formula (the same also applies to average thickness t2 of the B2 compound layers).

(Average thickness $t1$ of $B1$ compound layers)=
(thickness of $B$ layer formed by stacking only
$B1$ compound layers)÷(the number of stacked
$B1$ compound layers).

As the above-mentioned t2/t1 satisfies the relation of 0.5<t2/t1≤10.0, the boundary wear resistance in the coated cBN tool can be dramatically improved. Therefore, even under the severe operating conditions that impacts and vibrations are repeatedly applied, for example, as in the case of interrupted cutting, a sufficient surface roughness life can be provided. In this case, t2/t1 preferably satisfies the relation of 1.6<t2/t1≤5.0, and more preferably satisfies the relation of 3.0<t2/t1≤4.0.

Furthermore, in the case where the A layer is provided closer to the surface-side than the B layer, assuming that the thickness of each B1 compound layer is indicated as $t1_0$, the thickness of each B2 compound layer is indicated as $t2_0$, and the thickness ratio between the B1 compound layer and the B2 compound layer that are in contact with each other is indicated as $t2_0/t1_0$, it is preferable that $t2_0/t1_0$ satisfies the relation of $1.0 < t2_0/t1_0 \leq 5.0$ on the cBN sintered body-side, decreases toward the A layer-side, and satisfies the relation of $0.5 < t2_0/t1_0 < 3.0$ on the A layer-side. Accordingly, occurrence of cracking can be suppressed on the A layer-side of the B layer while cracking can be prevented from spreading to the cBN sintered body-side on the cBN sintered body-side of the B layer. In this case, the A layer-side of the B layer indicates the smallest region of: a region that is located at a distance of 0 μm or more and ½ or less of the thickness of the B layer from the surface of the B layer located closest to the A layer toward the inside of the B layer; and a region that is located at a distance of 0 μm or more and 0.1 μm or less from the surface of the B layer located closest to the A layer toward the inside of the B layer. Furthermore, the cBN sintered body-side of the B layer indicates the smallest region of: a region that is located at a distance of 0 μm or more and ½ or less of the thickness of the B layer from the surface of the B layer located closest to the cBN sintered body toward the inside of the B layer; and a region that is located at a distance of 0 μm or more and 0.1 μm or less from the surface of the B layer located closest to the cBN sintered body toward the inside of the B layer.

As to the B layer containing Si described above, it is preferable that the average value of the Si composition in the entire B layer is 0.005 or more and 0.1 or less. Thereby, the peeling resistance of the B layer can be improved and oxygen can be prevented from infiltrating into the interface between the B layer and the A layer or the base member. The average value of the Si composition in the entire B layer is more preferably 0.01 or more and 0.07 or less, and further more preferably 0.035 or more and 0.05 or less. In the present specification, the average value of the Si composition in the entire B layer is to be calculated using the following calculation formula.

(Average value of Si composition in entire $B$ layer)
={total sum of (Si composition of each layer
forming $B$ layer)×(thickness of each layer)}÷
(thickness of entire $B$ layer).

<C Layer>

It is preferable that the coating film of the present embodiment further includes a C layer provided between the A layer and the B layer. It is preferable that this C layer includes $McLc_{zc}$ (Mc represents one or more of group 4 elements, group 5 elements and group 6 elements in the periodic table, Al and Si; Lc represents one or more of B, C, N, and O; and zc is 0 or more and 0.85 or less). By providing the C layer, the A layer and the B layer that are different in characteristics and structure can be firmly adhered to each other. Furthermore, when the A layer is provided closer to the surface-side than the B layer, damage resulting from wear of the A layer and cracking occurring in the A layer can be blocked by the C layer from spreading to the base member-side.

Furthermore, it is preferable that the thickness of the C layer is 0.005 μm or more and 0.5 μm or less. As the thickness of the C layer is 0.005 or more, the adhesiveness between the A layer and the B layer can be improved. Furthermore, as the thickness of the C layer is 0.5 μm or less, the thickness of the coating film can be prevented from being excessively increased by the C layer. In this case, the thickness of the C layer is more preferably 0.01 μm or more and 0.2 μm or less.

In the above-described $McLc_{zc}$, it is preferable that a composition zc of Lc is more than 0 and less than 0.7. As zc is more than 0, the heat resistance and the chemical wear resistance of the C layer can be improved, and cracking occurring in the A layer can be blocked from spreading toward the base member-side. In addition, zc is more preferably 0.2 or more and 0.5 or less.

Furthermore, it is preferable that the C layer includes at least one or more of elements forming the A layer and the B layer. As the C layer includes the same element as that included in the A layer in this way, the adhesiveness between the C layer and the A layer can be improved. Furthermore, as the C layer includes the same element as that included in the B layer, the adhesiveness between the C layer and the B layer can be improved. Also, it is suitable that the C layer includes at least one or more of elements forming a portion in each of the A layer and the B layer that is located on the C layer-side because the adhesiveness tends to be further improved.

<D Layer>

It is preferable that the coating film of the present embodiment further includes a D layer provided between the base member and the B layer. It is preferable that this D layer includes $MdLd_{zd}$ (Md represents one or more of group 4 elements, group 5 elements and group 6 elements in the periodic table, Al and Si; Ld represents one or more of B, C, N, and O; and zd is 0.85 or more and 1.0 or less). Such a D layer is excellent in adhesiveness with the cBN sintered body. Therefore, the coating film including the D layer can improve the adhesiveness between the coating film and the cBN sintered body. In addition, Ld is more preferably N.

In this case, it is more preferable that the D layer includes $(Al_{1-xd}Md2_{xd})Ld_{zd}$ (Md2 represents one or more of group 4 elements, group 5 elements and group 6 elements in the periodic table, and Si; and xd is 0.25 or more and 0.45 or less). In this way, it is suitable that the D layer contains Al since the adhesiveness between the coating film and the cBN sintered body tends to be further increased. It is considered that this is because the compound containing Al as in the above-described general formula is strongly bonded not only to the cBN particles but also to the binder phase in the cBN sintered body. In addition, Md2 is more preferably at least one or more of Ti, Cr, and V.

Furthermore, it is preferable that the thickness of the D layer is 0.05 μm or more and 1 μm or less. As the thickness of the D layer is 0.05 μm or more, the adhesiveness between the coating film and the cBN sintered body can be improved. Also, as the thickness of the D layer is 1 μm or less, the thickness of the coating film can be prevented from being excessively increased by the D layer. In this case, the thickness of the D layer is more preferably 0.1 µm or more and 0.5 µm or less.

<<Method of Manufacturing Coated cBN Tool>>

A method of manufacturing a coated cBN tool according to the present embodiment includes for example the steps of: preparing a base member in which at least a cutting edge portion includes a cBN sintered body; and forming a coating film on the cBN sintered body.

<Step of Preparing Base Member>

The base member of the present embodiment can be manufactured by bonding a base member main body and a base member formed of a cBN sintered body. The base member main body can be made using a material, for example, cemented carbide. Such a base member main body can be manufactured, for example, by the conventionally known sintering method and molding method. Furthermore, the base member formed of a cBN sintered body can be manufactured, for example, by sintering a mixture made of cBN particles and raw material powder of a binder phase under high-temperature and high-pressure conditions. Then, the base member formed of a cBN sintered body is bonded with the conventionally known braze material to an appropriate portion of the base member main body, which is then subjected to grinding processing and formed into a prescribed shape, with the result that the base member can be manufactured. In addition, it is a matter of course that the entire base member is formed of a cBN sintered body.

<Step of Forming Coating Film>

A coating film is formed on the base member obtained as described above, so that a coated cBN tool can be manufactured. In this case, it is preferable that the step of forming an coating film includes the step of forming a coating film by the arc ion plating method (the ion plating method for evaporating a solid material by utilizing vacuum arc discharge) or by the sputtering method. According to the arc ion plating method, a coating film can be formed using: a metal evaporation source containing metal species for forming a coating film; and reaction gas such as $CH_4$, $N_2$ or $O_2$. In addition, the conditions for forming a coating film can be conventionally known conditions. According to the sputtering method, a coating film can be formed using: a metal evaporation source containing metal species for forming a coating film; reaction gas such as $CH_4$, $N_2$, or $O_2$; and sputtering gas such as Ar, Kr, and Xe. Also in this case, the conditions for forming a coating film can be conventionally known conditions.

EXAMPLES

Although the present invention will be hereinafter described in greater detail with reference to Examples, the present invention is not limited thereto.

<<Manufacture of Coated cBN Tool>>

FIG. 1 is a cross-sectional view showing an example of the configuration of a coated cBN tool in Example. FIG. 2 is a cross-sectional view showing an example of the configuration of a main part of the coated cBN tool in Example.

<Manufacture of cBN Sintered Body>

As described below, cBN sintered bodies A to I each having a composition shown in Table 1 were manufactured. Each compound shown in the column of "X-ray Detecting Compound" in Table 1 is a compound detected when qualitatively analyzing the cross section or the surface of the cBN sintered body by an X-ray diffraction (XRD) apparatus.

(Manufacture of cBN Sintered Body A)

First, a mixture was obtained by mixing TiN powder having an average particle size of 1 µm and Ti powder having an average particle size of 3 µm in an atomic ratio of Ti:N=1:0.6. This mixture was heat-treated for 30 minutes at 1200° C. in a vacuum and then ground. Thereby, intermetallic compound powder made of $TiN_{0.6}$ was obtained.

Then, a mixture was obtained by mixing intermetallic compound powder made of $TiN_{0.6}$ and Al powder having an average particle size of 4 µm in a mass ratio of $TiN_{0.6}$:Al=90:10. This mixture was heat-treated for 30 minutes at 1000° C. in a vacuum. The compound obtained by the heat treatment was uniformly ground by the ball-milling method using ball media made of cemented carbide and having a diameter of 6 mm. Thereby, raw material powder of the binder phase was obtained.

Then, cBN particles having an average particle size of 1.5 µm and raw material powder of the binder phase were blended so as to achieve 30 vol % of the content of the cBN particles in the cBN sintered body, and then, uniformly mixed by the ball mill mixing method using ball media made of boron nitride and having a diameter of 3 mm, thereby obtaining powdery mixture. Then, this mixture was stacked on a support substrate made of cemented carbide, and then introduced into a capsule made of Mo, which was then sintered for 30 minutes at pressure of 5.5 GPa and at a temperature of 1300° C. using an ultra-high pressure apparatus. Thereby, a cBN sintered body A was obtained.

(Manufacture of cBN Sintered Bodies B to G)

As shown in Table 1, cBN sintered bodies B to G were obtained in the same manner as with cBN sintered body A, except that cBN particles having different volume contents and different average particle sizes were used.

(Manufacture of cBN Sintered Body H)

First, a mixture was obtained by mixing TiCN powder having an average particle size of 1 µm and Ti powder having an average particle size of 3 µm in an atomic ratio of Ti:C:N=1:0.3:0.3. Then, this mixture was heat-treated for 30 minutes at 1200° C. in a vacuum and then ground. Thereby, intermetallic compound powder made of $TiC_{0.3}N_{0.3}$ was obtained.

Then, a mixture was obtained by mixing intermetallic compound powder made of $TiC_{0.3}N_{0.3}$ and Al powder having an average particle size of 4 µm in a mass ratio of $TiC_{0.3}N_{0.3}$:Al=90:10. This mixture was heat-treated for 30 minutes at 1000° C. in a vacuum. The compound obtained by the heat treatment was uniformly ground by the ball-milling method using ball media made of cemented carbide and having a diameter of 6 mm. Thereby, raw material powder of the binder phase was obtained. Then, the raw material powder of the binder phase was used to obtain a cBN sintered body H in the same manner as with cBN sintered body A, except that cBN particles having different volume contents and different average particle sizes were used, as shown in Table 1.

(Manufacture of cBN Sintered Body I)

First, a mixture was obtained by mixing TiC powder having an average particle size of 1 µm and Ti powder having an average particle size of 3 µm in an atomic ratio of Ti:C=1:0.6. This mixture was heat-treated for 30 minutes at 1200° C. in a vacuum and then ground. Thereby, intermetallic compound powder made of $TiC_{0.6}$ was obtained.

Then, a mixture was obtained by mixing intermetallic compound powder made of $TiC_{0.6}$ and Al powder having an average particle size of 4 µm in a mass ratio of $TiC_{0.6}$:Al=90:10. This mixture was heat-treated for 30 minutes at 1000° C. in a vacuum. The compound obtained by the heat treatment was uniformly ground by the ball-milling method using ball media made of cemented carbide and having a diameter of 6 mm. Thereby, raw material powder of the binder phase was obtained. Then, the raw material powder of the binder phase was used to obtain a cBN sintered body I in the same manner as with cBN sintered body A, except that cBN particles having different volume contents and different average particle sizes were used, as shown in Table 1.

TABLE 1

| cBN Sintered Body | cBN Particles | | Raw Material Powder of Binder Phase | X-ray Detecting Compound |
|---|---|---|---|---|
| | Volume Content (Vol %) | Average Particle Size (μm) | | |
| A | 30 | 1.5 | $TiN_{0.6}$, Al | cBN, TiN, $TiB_2(AlB_2)$ |
| B | 80 | 1.5 | $TiN_{0.6}$, Al | cBN, TiN, $TiB_2(AlB_2)$ |
| C | 50 | 1.5 | $TiN_{0.6}$, Al | cBN, TiN, $TiB_2(AlB_2)$ |
| D | 58 | 1.5 | $TiN_{0.6}$, Al | cBN, TiN, $TiB_2(AlB_2)$ |
| E | 65 | 1.5 | $TiN_{0.6}$, Al | cBN, TiN, $TiB_2(AlB_2)$ |
| F | 58 | 0.5 | $TiN_{0.6}$, Al | cBN, TiN, $TiB_2(AlB_2)$ |
| G | 58 | 3 | $TiN_{0.6}$, Al | cBN, TiN, $TiB_2(AlB_2)$ |
| H | 58 | 1.5 | $TiC_{0.3}N_{0.3}$, Al | cBN, TiCN, $TiB_2(AlB_2)$ |
| I | 58 | 1.5 | $TiC_{0.6}$, Al | cBN, TiC, $TiB_2(AlB_2)$ |

<Manufacture of Sample 1>

A coated cBN tool according to Sample 1 was manufactured as described below.

<Formation of Base Member>

A base member main body having a shape of DNGA150408 of the ISO standard and made of a cemented carbide material (equivalent to K10) was prepared. The above-described cBN sintered body A (shape: a 2-mm-thick triangular prism having isosceles triangles as bases whose vertex angle was 55° and sides sandwiching the vertex angle were each 2 mm) was bonded to an insert (corner portion) of this base member main body. A braze material made of Ti—Zr—Cu was used for bonding. Then, the outer circumferential surface, the upper surface and the lower surface of the bonded body were ground to form a negative land shape (a negative land width of 150 μm and a negative land angle of 25°) at the insert. In this way, a base member 3 having a cutting edge portion formed of cBN sintered body A (see FIG. 1) was obtained.

<Formation of Coating Film>

(Film Forming Apparatus)

A film forming apparatus used for forming a coating film will be hereinafter described in the subsequent steps. A vacuum pump is connected to the film forming apparatus, within which a vacuum chamber that can be evacuated is provided. A rotary table is placed inside the vacuum chamber. This rotary table is configured such that the base member can be placed thereon through a jig. The base member placed within the vacuum chamber can be heated by a heater placed inside the vacuum chamber. Also, a gas pipe for introducing gas for etching and film forming is connected to the vacuum chamber through a mass flow controller (MFC) for flow rate control. Furthermore, a tungsten filament for generating Ar ions for etching, or an arc evaporation source or a sputtering source for film formation to which a necessary power supply is connected is disposed within the vacuum chamber. Then, evaporation source raw material (target) required for film formation is placed in the arc evaporation source or the sputtering source.

(Etching of Base Member)

Base member 3 obtained as described above was placed within the vacuum chamber of the film forming apparatus, and the chamber was evacuated. Then, base member 3 was heated to 500° C. while rotating the rotary table at 3 rpm. Then, Ar gas was introduced into the vacuum chamber, a tungsten filament was discharged to generate Ar ions, a bias voltage was applied to base member 3, and base member 3 was etched by Ar ions. The etching conditions in this case are as described below.

Pressure of Ar gas: 1 Pa
Substrate bias voltage: −500V.

(Formation of D Layer)

Then, a D layer 20 was formed on base member 3 within the above-described film forming apparatus. Specifically, the D layer was formed while adjusting the vapor deposition time so as to achieve a thickness of 0.1 μm under the conditions described below.

Target: Al (50 atom %), Ti (50 atom %)
Introduced gas: $N_2$
Film forming pressure: 4 Pa
Arc discharge current: 150 A
Substrate bias voltage: −35V
Table rotation speed: 3 rpm.

(Formation of B Layer)

Subsequently to D layer 20, a B layer 30 was formed on D layer 20 within the film forming apparatus described above. Specifically, B1 compound layer 31 and B2 compound layer 32 were alternately formed each for 5 times repeatedly under the conditions described below, so that a B layer 30 formed of 10 layers in total and having a total thickness of 1.0 μm was formed (see FIG. 2). When forming the B layer, the vapor deposition time was adjusted to achieve B1 compound layer 31 having a thickness of 50 nm and B2 compound layer 32 having a thickness of 150 nm. In Sample 1, the lowermost layer of the B layer is B1 compound layer 31 while the uppermost layer thereof is B2 compound layer 32.

(Formation of B1 Compound Layer)

The B1 compound layer was formed under the conditions described below.

Target: Ti (90 atom %), Si (10 atom %)
Introduced gas: $N_2$
Film forming pressure: 3 Pa
Arc discharge current: 150 A
Substrate bias voltage: −40V.

(Formation of B2 Compound Layer)

The B2 compound layer was formed under the conditions described below.

Target: Al (65 atom %), Cr (35 atom %)
Introduced gas: $N_2$
Film forming pressure: 3 Pa
Arc discharge current: 150 A
Substrate bias voltage: −50V.

As described above, Sample 1 having a coating film 10 obtained by stacking D layer 20 and B layer 30 in this order on base member 3 was obtained.

<Manufacture of Samples 2 to 7>

Coated cBN tools according to Samples 2 to 7 were manufactured as described below.

(Formation of C Layer)

First, D layer 20 and B layer 30 were formed on the base member in the same manner as with Sample 1. Then, C layer 40 was formed on B layer 30 under the conditions described below. The thickness of C layer 40 was set at 0.1 μm by adjusting the vapor deposition time.

Target: Ti
Introduced gas: Ar
Film forming pressure: 1 Pa
Arc discharge current: 160 A
Substrate bias voltage: −75V
Table rotation speed: 3 rpm.

(Formation of A Layer)

After forming C layer 40, an A layer 50 was formed on C layer 40 under the conditions described below. In this case, the flow rate of the introduced gas ($N_2$ and $CH_4$) was adjusted so as to be set at C:N=1:1 in A layer 50. Then, the vapor deposition time was adjusted, thereby obtaining A layer 50 having a thickness that is different for each Sample, as shown in the column of the thickness of the A layer in Table 2.

Target: Ti
Introduced gas: $N_2$, $CH_4$
Film forming pressure: 2 Pa
Arc discharge current: 180 A
Substrate bias voltage: −350V
Table rotation speed: 3 rpm.

As described above, coated cBN tools according to Samples 2 to 7 each including coating film 10 obtained by stacking D layer 20, B layer 30, C layer 40, and A layer 50 in this order on base member 3 were obtained.

<Manufacture of Samples 8 to 49>

As shown in Tables 2 and 3, coated cBN tools according to Samples 8 to 49 were manufactured using cBN sintered bodies A to I. In Tables 2 and 3, each Sample marked with a symbol "*" in the left-side column represents a coated cBN tool according to each Example.

As shown in Table 2, for each of Samples 8 to 12 and 18 to 49, C layer 40 was not formed but A layer 20 was formed directly on B layer 30. Furthermore, for each of these Samples, a coating film was formed while appropriately making an adjustment within a range of the film forming conditions described below so as to achieve each layer shown in Tables 2 and 3.

(Film Forming Conditions)
Target: metallic element shown in the composition column of each layer in Tables 2 and 3
Introduced gas: appropriately select one or more from Ar, $N_2$, and $CH_4$
Film forming pressure: 0.1 Pa to 7 Pa
Arc discharge current: 60 A to 300 A
Substrate bias voltage: −700V to −25V
Table rotation speed: 2 rpm to 10 rpm.

TABLE 2

| | | Coating Film | | | | | | | |
|---|---|---|---|---|---|---|---|---|---|
| | | A Layer $MLa_{a1}$ | | C Layer $McLc_{c}$ | | | D Layer $MdLd_{d}$ | | Thickness of Entire |
| Coated cBN Tool | cBN Sintered Body | Composition | Thickness (μm) | Composition | Thickness (μm) | B Layer | Composition | Thickness (μm) | Coating Film μ |
| Sample 1 | A | None | 0.0 | None | — | Shown in Table 3 | $Ti_{0.5}Al_{0.5}N$ | 0.1 | 1.1 |
| 2 | | $TiC_{0.5}N_{0.5}$ | 0.1 | Ti | 0.1 | | | | 1.3 |
| *3 | | | 0.6 | | | | | | 1.8 |
| *4 | | | 1.0 | | | | | | 2.2 |
| *5 | | | 2.0 | | | | | | 3.2 |
| *6 | | | 5.0 | | | | | | 6.2 |
| 7 | | | 11.0 | | | | | | 12.2 |
| 8 | D | TiCN*1 | 1.5 | None | — | | $Al_{0.7}Cr_{0.3}N$ | 0.2 | 2.9 |
| *9 | | | | | | | | | |
| *10 | | | | | | | | | |
| *11 | | | | | | | | | |
| 12 | | | | | | | | | |
| 13 | B | $Ti_{0.5}Al_{0.5}N$ | 2.0 | $Ti_{0.5}Al_{0.5}N_{0.4}$ | 0.03 | | $Al_{0.6}Ti_{0.3}Cr_{0.1}N$ | 0.5 | 4.1 |
| *14 | | | | | | | | | 4.1 |
| *15 | | | | | | | | | 4.1 |
| *16 | | | | | | | | | 4.0 |
| 17 | | | | | | | | | 4.1 |
| 18 | C | $TiC_{0.1}N_{0.9}$ | 2.5 | None | — | | $Al_{0.5}Cr_{0.5}N$ | 1.0 | 4.3 |
| *19 | | | | | | | | | 4.3 |
| *20 | | | | | | | | | 4.3 |
| *21 | | | | | | | | | 4.3 |
| 22 | | | | | | | | | 4.3 |
| 23 | E | TiCN*2 | 1.8 | None | — | | $Al_{0.6}Cr_{0.4}N$ | 0.4 | 3.3 |
| *24 | | | | | | | | | 3.3 |
| *25 | | | | | | | | | 3.3 |
| *26 | | | | | | | | | 3.3 |
| 27 | | | | | | | | | 3.4 |
| 28 | F | $Ti_{0.9}W_{0.1}C_{0.2}N_{0.8}$ | 1.0 | None | — | | $Al_{0.65}Cr_{0.25}W_{0.1}N$ | 0.5 | 1.6 |
| *29 | | | | | | | | | 2.0 |
| *30 | | | | | | | | | 2.5 |
| *31 | | | | | | | | | 2.2 |
| 32 | | | | | | | | | 4.9 |
| 33 | | | | | | | | | 8.3 |
| 34 | G | $TiC_{0.1}N_{0.9}$ | 0.1 | None | — | | $Al_{0.7}Ti_{0.3}N$ | 0.1 | 0.4 |
| *35 | | TiCN*3 | 1.0 | | | | | 0.2 | 2.6 |
| *36 | | | 2.0 | | | | | 0.3 | 5.1 |
| *37 | | | 4.0 | | | | | 0.6 | 8.8 |
| 38 | | | 8.0 | | | | | 1.2 | 16.2 |
| *39 | A | TiCN*4 | 1.5 | None | — | | $Al_{0.7}Cr_{0.3}N$ | 0.2 | 3.0 |
| *40 | B | | | | | | | | |
| *41 | C | | | | | | | | |
| *42 | D | | | | | | | | |

TABLE 2-continued

| | | Coating Film | | | | | | | |
|---|---|---|---|---|---|---|---|---|---|
| | | A Layer $MLa_{za1}$ | | C Layer $McLc_{zc}$ | | | D Layer $MdLd_{zd}$ | | Thickness of Entire |
| Coated cBN Tool | Sintered Body | Composition | Thickness (μm) | Composition | Thickness (μm) | B Layer | Composition | Thickness (μm) | Coating Film μ |
| * 43 | E | | | | | | | | |
| * 44 | F | | | | | | | | |
| * 45 | G | | | | | | | | |
| * 46 | H | | | | | | | | |
| * 47 | I | | | | | | | | |
| 48 | D | None | 0 | None | — | | $Al_{0.7}Cr_{0.3}N$ | 0.2 | 3.1 |
| 49 | | $TiC_{0.2}N_{0.8}$ | 2.8 | None | — | | TiN | 0.2 | 3.1 |

TABLE 3

(1/2)

| | Coating Film B Layer | | | | | | | | | |
|---|---|---|---|---|---|---|---|---|---|---|
| | B1 Compound Layer $(Ti_{1-xb1-yb1}Si_{xb1}M1_{yb1})(C_{1-zb1}N_{zb1})$ | | B2 Compound Layer $(Al_{1-xb2}M2_{xb2})(C_{1-zb2}N_{zb2})$ | | | Thickness of Entire B Layer (μm) | t2/t1 Average | $t2_0/t1_0$ | | Average Value of Si Composition |
| Coated cBN Tool | Composition | Average Thickness t1 (nm) | Composition | Average Thickness t2 (nm) | Number of Layers | | | Base Member-Side | A Layer-Side | |
| Sample 1 | $Ti_{0.9}Si_{0.1}N_{0.9}$ | 50 | $Al_{0.65}Cr_{0.35}N$ | 150 | 10 | 1.0 | 3.0 | — | — | 0.025 |
| 2 | | | | | | | | | | |
| * 3 | | | | | | | | | | |
| * 4 | | | | | | | | | | |
| * 5 | | | | | | | | | | |
| * 6 | | | | | | | | | | |
| 7 | | | | | | | | | | |
| 8 | $Ti_{0.995}Si_{0.005}N$ | 40 | $Al_{0.7}Cr_{0.3}N$ | 200 | 10 | 1.2 | 5.0 | — | — | 0.001 |
| * 9 | $Ti_{0.95}Si_{0.05}N$ | | | | | | | | | 0.008 |
| * 10 | $Ti_{0.85}Si_{0.15}N$ | | | | | | | | | 0.025 |
| * 11 | $Ti_{0.8}Si_{0.2}N$ | | | | | | | | | 0.033 |
| 12 | $Ti_{0.67}Si_{0.33}N$ | | | | | | | | | 0.055 |
| 13 | $Ti_{0.8}Si_{0.2}N$ | 10 | $Al_{0.6}Ti_{0.3}Cr_{0.1}N$ | 125 | 24 | 1.6 | 12.5 | — | — | 0.015 |
| * 14 | | 35 | | | 20 | 1.6 | 3.6 | | | 0.044 |
| * 15 | | 75 | | | 16 | 1.6 | 1.7 | | | 0.075 |
| * 16 | | 120 | | | 12 | 1.5 | 1.0 | | | 0.098 |
| 17 | | 400 | | | 6 | 1.6 | 0.3 | | | 0.152 |
| 18 | $Ti_{0.94}Si_{0.06}N$ | 75 | $Al_{0.9}Nb_{0.1}N$ | 125 | 8 | 0.8 | 1.7 | 3 | 1 | 0.021 |
| * 19 | | | $Al_{0.7}Ti_{0.2}Nb_{0.1}N$ | | | | | | | |
| * 20 | | | $Al_{0.5}Ti_{0.4}Nb_{0.1}N$ | | | | | | | |
| 21 | | | $Al_{0.35}Ti_{0.55}Nb_{0.1}N$ | | | | | | | |
| 22 | | | $Al_{0.2}Ti_{0.7}Nb_{0.1}N$ | | | | | | | |

(2/2)

| | Coating Film B Layer | | | | | | | | | |
|---|---|---|---|---|---|---|---|---|---|---|
| | B1 Compound Layer $(Ti_{1-xb1-yb1}Si_{xb1}M1_{yb1})(C_{1-zb1}N_{zb1})$ | | B2 Compound Layer $(Al_{1-xb2}M2_{xb2})(C_{1-zb2}N_{zb2})$ | | | Thickness of Entire B Layer (μm) | t2/t1 Average | $t2_0/t1_0$ | | Average Value of Si Composition |
| Coated cBN Tool | Composition | Average Thickness t1 (nm) | Composition | Average Thickness t2 (nm) | Number of Layers | | | Base Member-Side | A Layer-Side | |
| Sample 23 | $Ti_{0.78}Si_{0.22}N$ | 60 | $Al_{0.6}Ti_{0.1}Cr_{0.3}N$ | 20 | 28 | 1.1 | 0.3 | — | — | 0.165 |

TABLE 3-continued

| | | | | | | | | | | |
|---|---|---|---|---|---|---|---|---|---|---|
| * | 24 | | | | | 75 | 16 | 1.1 | 1.3 | | | 0.098 |
| * | 25 | | | | | 120 | 12 | 1.1 | 2.0 | | | 0.073 |
| * | 26 | | | | | 210 | 8 | 1.1 | 3.5 | | | 0.049 |
| | 27 | | | | | 350 | 6 | 1.2 | 5.8 | | | 0.032 |
| | 28 | $Ti_{0.7}Cr_{0.18}Si_{0.12}N$ | 35 | $Al_{0.65}Cr_{0.25}W_{0.1}N$ | 50 | 2 | 0.085 | 1.4 | — | — | 0.049 |
| * | 29 | | | | | | 12 | 0.5 | | | | 0.049 |
| * | 30 | | | | | | 24 | 1.0 | | | | 0.049 |
| * | 31 | | | | | | 16 | 0.7 | | | | 0.049 |
| * | 32 | | | | | | 80 | 3.4 | | | | 0.049 |
| | 33 | | | | | | 160 | 6.8 | | | | 0.049 |
| | 34 | $Ti_{0.85}Si_{0.15}N$ | 60 | $Al_{0.55}Cr_{0.4}Si_{0.05}N$ | 150 | 2 | 0.2 | 2.5 | — | — | 0.079 |
| * | 35 | | | | | 220 | 10 | 1.4 | 3.7 | | | 0.071 |
| * | 36 | | | | | | 20 | 2.8 | 3.7 | | | 0.071 |
| * | 37 | | | | | | 30 | 4.2 | 3.7 | | | 0.071 |
| | 38 | | | | | | 50 | 7.0 | 3.7 | | | 0.071 |
| * | 39 | $Ti_{0.82}Si_{0.18}N$ | 40 | $Al_{0.7}Cr_{0.3}N$ | 120 | 16 | 1.3 | 3.0 | | | 0.045 |
| * | 40 | | | | | | | | | | | |
| * | 41 | | | | | | | | | | | |
| * | 42 | | | | | | | | | | | |
| * | 43 | | | | | | | | | | | |
| * | 44 | | | | | | | | | | | |
| * | 45 | | | | | | | | | | | |
| * | 46 | | | | | | | | | | | |
| * | 47 | | | | | | | | | | | |
| | 48 | $Ti_{0.82}Si_{0.18}N$ | 40 | $Al_{0.7}Cr_{0.3}N$ | 120 | 36 | 2.9 | 3.0 | — | — | 0.045 |
| | 49 | | | | None | | | | | | 0 |

<Manufacture of Samples 8 to 12>

A base member was obtained in the same manner as with Sample 1 using a cBN sintered body D, and then, a D layer and a B layer each having a configuration shown in Tables 2 and 3 were stacked in this order on the base member while adjusting the film forming conditions as appropriate. For each of Samples 8 to 12, the B layer was formed while changing the film forming conditions for each Sample so as to achieve the B1 compound layer having a composition shown in Table 3.

(Formation of A layer: TiCN*[1])

Furthermore, for each of Samples 8 to 12, an A layer including a TiCN layer having compositions of C and N changing in a slope-like manner in the thickness direction (the direction from the base member-side toward the coating film surface) was stacked on the B layer. In Table 2, the composition of the A layer is indicated as "TiCN*[1]" for convenience. The specific configuration of the A layer is shown in Table 4. The A layer was formed as in the following manner.

First, 0.5 μm of a TiN layer was formed using only $N_2$ as introduced gas. Then, 0.5 μm of a TiCN layer having an N composition decreasing in a slope-like manner (C composition increasing in a slope-like manner) was formed while gradually increasing the flow rate of $CH_4$ in introduced gas. The composition of the TiCN layer was ultimately $TiC_{0.3}N_{0.7}$. Then, 0.5 μm of a $TiC_{0.3}N_{0.7}$ layer was formed in the state where the flow rate ratio between $N_2$ and $CH_4$ was fixed. In this way, a coating film was obtained, in which an A layer including a TiCN layer having compositions of C and N changing in a slope-like manner in the thickness direction was stacked on the B layer. Thereby, the coated cBN tools according to Samples 8 to 12 were obtained.

TABLE 4

| Coated cBN Tool | A Layer | Step | Distance from Base Member-side (μm) | Composition |
|---|---|---|---|---|
| Samples 8 to 12 | TiCN*[1] | — | 0-0.5 | TiN |
| | | | 0.5-1.0 | TiN → $TiC_{0.3}N_{0.7}$ |
| | | | 1.0-1.5 | $TiC_{0.3}N_{0.7}$ |

TABLE 4-continued

| Coated cBN Tool | A Layer | Step | Distance from Base Member-side (μm) | Composition |
|---|---|---|---|---|
| Samples 23 to 27 | TiCN*[2] | 1 | 0-0.3 | TiN |
| | | 2 | 0.3-0.5 | $TiC_{0.15}N_{0.85}$ |
| | | 3 | 0.5-1.5 | $TiC_{0.25}N_{0.75}$ |
| | | 4 | 1.5-1.8 | $TiC_{0.5}N_{0.5}$ |
| Sample 35 (Steps 1 to 5: 1 Cycle) | TiCN*[3] | 1 | 0-0.2 | $TiC_{0.1}N_{0.9}$ |
| Sample 36 (Steps 1 to 6: 1 Cycle) | | 2 | 0.2-0.4 | $TiC_{0.3}N_{0.7}$ |
| | | 3 | 0.4-0.6 | $TiC_{0.5}N_{0.5}$ |
| Sample 37 (Steps 1 to 6: 2 Cycles) | | 4 | 0.6-0.8 | $TiC_{0.6}N_{0.4}$ |
| | | 5 | 0.8-1.0 | $TiC_{0.4}N_{0.6}$ |
| Sample 38 (Steps 1 to 6: 4 Cycles) | | 6 | 1.0-2.0 | TiN |
| Samples 39 to 47 | TiCN*[4] | — | 0-0.8 | TiN |
| | | | 0.8-1.0 | TiN → $TiC_{0.3}N_{0.7}$ |
| | | | 1.0-1.5 | $TiC_{0.3}N_{0.7}$ |

In Table, "TiN→$TiC_{0.3}N_{0.7}$" means that the composition changes from TiN to $TiC_{0.3}N_{0.7}$ in a slope-like manner.

<Manufacture of Samples 13 to 17>

A base member was obtained in the same manner as with Sample 1 using a cBN sintered body B, and then, a D layer, a B layer, a C layer, and an A layer each having a configuration shown in Tables 2 and 3 were stacked in this order on the base member while adjusting the film forming conditions as appropriate, to form a coating film. Thereby, coated cBN tools according to Samples 13 to 17 were obtained. In addition, for each of Samples 13 to 17, the B layer was formed while changing the film forming conditions for each Sample so as to achieve numerical values shown in Table 3 for the number of layers forming the B layer and average thickness t1 of the B1 compound layers.

(Formation of C Layer)

After forming the B layer, a C layer was formed so as to have a thickness of 0.03 μm under the conditions described below.

Target: Ti (50 atom %), Al (50 atom %)

Introduced gas: $N_2$

Film forming pressure: 0.2 Pa
Arc discharge current: 150 A
Substrate bias voltage: −80V
Table rotation speed: 8 rpm.

<Manufacture of Samples 18 to 22>

A base member was obtained in the same manner as with Sample 1 using a cBN sintered body C, and then, a D layer, a B layer and an A layer each having a configuration shown in Tables 2 and 3 were stacked in this order on the base member while adjusting the film forming conditions as appropriate, thereby forming a coating film.

In this case, for each of Samples 18 to 22, the film forming conditions were changed for each Sample such that the B2 compound layer had a composition shown in Table 3. Furthermore, the B1 compound layer of four layers having different thickness and the B2 compound layer of four layers having different thickness were stacked, thereby forming a B layer formed of 8 layers in total. This B layer was formed specifically as in the following manner.

After forming the D layer, 50 nm of a B1 compound layer was formed, on which 150 nm of a B2 compound layer was formed. Then, a B1 compound layer (60 nm) and a B2 compound layer (140 nm) were stacked in this order, on which a B1 compound layer (90 nm) and a B2 compound layer (110 nm) were stacked in this order, on which a B1 compound layer (100 nm) and a B2 compound layer (100 nm) were finally stacked, thereby forming a B layer. In this B layer, the average thickness of the B1 compound layers is 75 nm while the average thickness of the B2 compound layers is 125 nm. Thus, coated cBN tools according to Samples 18 to 22 were obtained.

<Manufacture of Samples 23 to 27>

A base member was obtained in the same manner as with Sample 1 using a cBN sintered body E, and then, a D layer and a B layer each having a configuration shown in Tables 2 and 3 were stacked in this order on the base member while adjusting the film forming conditions as appropriate. In addition, for each of Samples 23 to 27, the B layer was formed while changing the film forming conditions for each Sample so as to achieve numerical values shown in Table 3 for the number of layers forming the B layer and average thickness t2 of the B2 compound layers.

(Formation of A Layer: TiCN$^{*2}$)

Furthermore, for each of Samples 23 to 27, an A layer including a TiCN layer having compositions of C and N changing in a step-like manner in the thickness direction was stacked on the B layer. In Table 2, the composition of the A layer is indicated as "TiCN$^{*2}$" for convenience. The specific configuration of the A layer is shown in Table 4. As shown in Table 4, the A layer was formed while gradually changing the composition of the introduced gas for each prescribed thickness (step) from the base member-side (the cBN sintered body-side). Thereby, a coating film was obtained, in which the A layer including a TiCN layer having compositions of C and N changing in a step-like manner in the thickness direction was stacked on the B layer. Thereby, coated cBN tools according to Samples 23 to 27 were obtained.

<Manufacture of Samples 28 to 33>

A base member was obtained in the same manner as with Sample 1 using a cBN sintered body F, and then, a D layer, a B layer and an A layer each having a configuration shown in Tables 2 and 3 were stacked in this order on the base member while adjusting the film forming conditions as appropriate, to form a coating film. Thereby, coated cBN tools according to Samples 28 to 33 were obtained. In addition, in the case of each of Samples 28 to 33, a B layer formed of different number of layers for each Sample as shown in Table 3 was formed.

<Manufacture of Sample 34>

A base member was obtained in the same manner as with Sample 1 using a cBN sintered body G, and then, a D layer, a B layer and an A layer each having a configuration shown in Tables 2 and 3 were stacked in this order on the base member while adjusting the film forming conditions as appropriate, to form a coating film. Thereby, a coated cBN tool according to Sample 34 was obtained.

<Manufacture of Samples 35 to 38>

A base member was obtained in the same manner as with Sample 1 using a cBN sintered body G, and then, a D layer and a B layer each having a configuration shown in Tables 2 and 3 were stacked in this order on the base member while adjusting the film forming conditions as appropriate.

(Formation of A Layer: TiCN$^{*3}$)

Furthermore, for each of Samples 35 to 38, an A layer formed of a TiCN layer having compositions of C and N changing in a step-like manner in the thickness direction was stacked on the B layer, thereby forming a coating film. In Table 2, the composition of the A layer is indicated as "TiCN$^{*3}$" for convenience. The specific configuration of the A layer is shown in Table 4.

As shown in Table 4, for Sample 35, the flow rate of each of N$_2$ and CH$_4$ in the introduced gas was changed in steps 1 to 5, and layers having different compositions were sequentially stacked, thereby forming an A layer having a total thickness of 1.0 μm. For Sample 36, layers according to steps 1 to 5 were stacked in the same manner as with Sample 35. Further in step 6, CH$_4$ was stopped and 1.0 μm of a TiN layer was stacked, thereby forming an A layer having a total thickness of 2.0 μm.

For Sample 37, layers according to steps 1 to 6 were stacked in the same manner as with Sample 36, on which layers according to steps 1 to 6 were further stacked again, thereby forming an A layer having a total thickness of 4 μm. In Table 5, in this way, steps 1 to 6 are defined as 1 cycle, and the process of repeating this 1 cycle twice is defined as "2 cycles". For Sample 38, 4 cycles of steps 1 to 6 were similarly performed to form an A layer having a total thickness of 8 μm. In the manner as described above, coated cBN tools according to Samples 35 to 38 were obtained.

<Manufacture of Samples 39 to 47>

A base member was obtained in the same manner as with Sample 1 using each of cBN sintered bodies A to I, and then, a D layer and a B layer each having a configuration shown in Tables 2 and 3 were stacked in this order on the base member while adjusting the film forming conditions as appropriate.

(Formation of A Layer: TiCN$^{*4}$)

Furthermore, for each of Samples 39 to 47, an A layer including a TiCN layer having compositions of C and N changing in a slope-like manner in the thickness direction (the direction from the base member-side toward the coating film surface) was stacked on a B layer, thereby forming a coating film. In Table 2, the composition of the A layer is indicated as "TiCN$^{*4}$" for convenience. The specific configuration of the A layer is shown in Table 4. The A layer was formed in the same manner as with "TiCN$^{*1}$" described above, except that the timing at which CH$_4$ was caused to flow into introduced gas (the distance from the base member-side) was changed as shown in Table 4. Thereby, coated cBN tools according to Samples 39 to 47 were obtained.

<Manufacture of Sample 48>

A base member was obtained in the same manner as with Sample 1 using a cBN sintered body D, and then, a D layer and a B layer each having a configuration shown in Tables 2 and 3 were stacked in this order on the base member while adjusting the film forming conditions as appropriate. Thereby, a coated cBN tool according to Sample 48 was obtained.

<Manufacture of Sample 49>

A base member was obtained in the same manner as with Sample 1 using a cBN sintered body D. Without forming a B layer and a C layer, a D layer and an A layer each having a configuration shown in Tables 2 and 3 were stacked in this order on the base member while adjusting the film forming conditions as appropriate, thereby forming a coating layer. Thereby, a coated cBN tool according to Sample 49 was obtained.

<<Evaluations>>

The cutting performance and the surface roughness life of the coated cBN tool according to each of Samples 1 to 49, which was obtained as described above, were evaluated by light interrupted cutting of hardened steel.

<Measurement of Flank Face Wear Amount VB and Surface Roughness Rz>

A tool for each Sample was used to perform cutting processing at a cutting distance of 4 km according to the cutting conditions described below. Then, a flank face wear amount VB of the tool was measured using an optical microscope. Furthermore, "ten-point average roughness (μm)" (that is, Rzjis) of the work material after processing was measured based on "JIS B 0601" and defined as surface roughness Rz. The results are shown in Table 5. In Table 5, the smaller the flank face wear amount VB is, the more the flank face wear resistance is excellent. Also, Table 5 shows that the smaller this Rz is, the more the boundary wear resistance is excellent, so that high precision processing can be implemented.

(Cutting Conditions)

Work material: hardened steel SCM415H (HRC60) having an outer diameter of φ100 and having an outer diameter portion provided with one V-shaped groove.

Cutting speed: 150 m/min

Feed rate: f=0.1 mm/rev

Cutting depth: ap=0.1 mm

Cutting oil: none (dry cutting).

<Measurement of Surface Roughness Life>

Then, the surface roughness life in high precision processing was measured based on the life determination criterion defined as Rz=3.2 μm. Specifically, one set of processing at a cutting distance of 500 m was repeatedly performed under the above-described cutting conditions; surface roughness Rz of the work material was measured using a surface roughness meter each time one set of processing ended; and then, the test was ended at the point of time when Rz exceeded 3.2 μm. Then, the total cutting distance (km) was calculated based on 500 m×the number of sets of processing. Furthermore, a scatter diagram was prepared in which the vertical axis shows Rz while the horizontal axis shows a cutting distance, to obtain the cutting distance at which Rz reached 3.2 μm on the straight line connecting two points of the end point and the point immediately before the end point in the scatter diagram. This obtained cutting distance was defined as a surface roughness life. The results thereof are shown in Table 5.

TABLE 5

| | | Evaluation Results | | |
|---|---|---|---|---|
| | | At 4 km | | Based on Rz = |
| | | Flank Face | Surface | 3.2 μm Surface |
| | | Wear Amount | Roughness | Roughness Life |
| | Coated cBN Tool | VB (mm) | Rz (μm) | (km) |
| | Sample 1 | 0.103 | 3.7 | 3.1 |
| | 2 | 0.084 | 3.4 | 3.6 |
| * | 3 | 0.067 | 2.58 | 8.2 |
| * | 4 | 0.057 | 2.48 | 9.1 |
| * | 5 | 0.053 | 2.53 | 8.7 |
| * | 6 | 0.048 | 2.63 | 8.3 |
| | 7 | 0.049 | 3.69 | 3.2 |
| | 8 | 0.063 | 3.5 | 3.3 |
| * | 9 | 0.053 | 2.53 | 8.8 |
| * | 10 | 0.052 | 2.41 | 9.2 |
| * | 11 | 0.054 | 2.48 | 9 |
| | 12 | 0.069 | 3.3 | 3.9 |
| | 13 | 0.062 | 3.36 | 3.8 |
| * | 14 | 0.054 | 2.44 | 9.1 |
| * | 15 | 0.057 | 2.52 | 8.8 |
| * | 16 | 0.06 | 2.58 | 8.6 |
| | 17 | 0.103 | 4.1 | 2.7 |
| | 18 | 0.058 | 3.57 | 3.7 |
| * | 19 | 0.054 | 2.46 | 9 |
| * | 20 | 0.057 | 2.52 | 8.8 |
| * | 21 | 0.062 | 2.66 | 8.4 |
| | 22 | 0.078 | 3.42 | 3.7 |
| | 23 | 0.067 | 3.58 | 3.2 |
| * | 24 | 0.061 | 2.79 | 8.4 |
| * | 25 | 0.057 | 2.62 | 8.6 |
| * | 26 | 0.055 | 2.51 | 8.8 |
| | 27 | 0.062 | 3.31 | 3.9 |
| | 28 | 0.055 | 3.72 | 3.1 |
| * | 29 | 0.061 | 2.71 | 8.2 |
| * | 30 | 0.057 | 2.63 | 8.5 |
| * | 31 | 0.054 | 2.59 | 8.7 |
| * | 32 | 0.052 | 2.61 | 8.4 |
| | 33 | 0.086 | 3.56 | 3.4 |
| | 34 | 0.063 | 3.53 | 3.7 |
| * | 35 | 0.054 | 2.5 | 9 |
| * | 36 | 0.051 | 2.67 | 8.6 |
| * | 37 | 0.05 | 2.72 | 8.2 |
| | 38 | 0.063 | 3.8 | 3 |
| * | 39 | 0.055 | 2.61 | 8.3 |
| * | 40 | 0.067 | 2.69 | 8.1 |
| * | 41 | 0.051 | 2.47 | 9 |
| * | 42 | 0.053 | 2.45 | 9.1 |
| * | 43 | 0.052 | 2.49 | 8.9 |
| * | 44 | 0.053 | 2.5 | 8.8 |
| * | 45 | 0.054 | 2.51 | 8.7 |
| * | 46 | 0.052 | 2.47 | 9 |
| * | 47 | 0.051 | 2.49 | 8.9 |
| | 48 | 0.09 | 3.9 | 2.6 |
| | 49 | 0.057 | 4.2 | 2.3 |

<<Results and Consideration>>

In Table 5, each Sample marked with a symbol "*" in the left-side column represents a coated cBN tool according to each of Examples. As apparent from Tables 1 to 5, it was confirmed that coated cBN tools according to Examples having the above-described configurations (1) to (9) each were excellent in flank face wear resistance and boundary wear resistance, and exhibited an excellent tool life in high precision processing of hardened steel, as compared with the tool not satisfying such conditions.

Furthermore, the findings obtained by analyzing the configuration of each Sample and the evaluation results in detail will be hereinafter described.

<Thickness of A Layer>

It was confirmed in the evaluations of Samples 3 to 6 that Samples 4 and 5 each having an A layer with a thickness of 1 μm or more and 3 μm or less tended to show a particularly excellent surface roughness life. Therefore, it is preferable that the thickness of the A layer is 1 µm or more and 3 µm or less.

<Average Value of Si Composition in Entire B Layer>

According to the evaluations of Samples 9 to 11, each of Samples 10 and 11 with 0.01 or more of an average value of the Si composition in the entire B layer exhibited an excellent surface roughness life, as compared with Sample 9 with less than 0.01 of an average value of the Si composition. Furthermore, according to the evaluations of Samples 24 to 26, Sample 26 with 0.07 or less of an average value of the Si composition exhibited an excellent surface roughness life, as compared with each of Samples 24 and 25 with more than 0.07 of an average value of the Si composition. Therefore, it is preferable that the average value of the Si composition in the entire B layer is 0.01 or more and 0.07 or less.

<Average Thickness Ratio Between B1 Compound Layers and B2 Compound Layers (t2/t1)>

According to the evaluations of Samples 14 to 16 and 24 to 26, Samples with t2/t1 satisfying the relation of $1.6<t2/t1\leq5.0$ tended to have a relatively long surface roughness life, as compared with Samples not satisfying such a condition. Also, Samples with t2/t1 satisfying the relation of $3.0<t2/t1\leq4.0$ showed a particularly long surface roughness life. Therefore, t2/t1 preferably satisfies the relation of $1.6<t2/t1\leq5.0$, and more preferably satisfies the relation of $3.0<t2/t1\leq4.0$.

<Composition of B2 Compound Layer>

According to the evaluations of Samples 19 to 21, an excellent surface roughness life was exhibited in each of Samples 20 and 21 in which a B2 compound layer includes $(Al_{1-xb2}M2_{xb2})(C_{1-zb2}N_{zb2})$ where M2 represents at least one of Ti and Cr; and a composition xb2 of M2 is 0.25 or more and 0.5 or less, as compared with Sample 19 not satisfying such conditions. Therefore, it is preferable that composition xb2 of M2 is 0.25 or more and 0.5 or less.

<Thickness of Entire B Layer>

According to the evaluations of Samples 29 to 32, Samples 30 and 31 each having an entire B layer thickness of 0.6 µm or more and 3.0 µm or less tended to have a relatively long surface roughness life as compared with Samples not satisfying such conditions. Therefore, it is preferable that the thickness of the entire B layer is 0.6 µm or more and 3.0 µm or less.

<Composition of C in A Layer>

According to the evaluations of Samples 35 to 37, it was confirmed that the surface roughness life tended to be particularly excellent in Sample 35 in which the A layer has, on its surface-side, a region where a composition of C is larger than that on the base member-side (cBN sintered body-side). Therefore, it is preferable that the A layer has, on its surface-side, a region where a composition of C is larger than that on the cBN sintered body-side.

<Volume Content of cBN Particles>

According to the evaluations of Samples 39 to 47, it was confirmed that the surface roughness life tended to be particularly long in each of Samples 41 to 47 in which the volume content of the cBN particles in the cBN sintered body was 50 vol % or more and 65 vol % or less. Therefore, it is preferable that the volume content of the cBN particles is 50 vol % or more and 65 vol % or less.

Although the embodiments and examples according to the present invention have been described as above, the configurations of the embodiments and examples described above are intended to be combined as appropriate from the beginning.

It should be understood that the embodiments and examples disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST 3 base member, 10 coating layer, 20 D layer, 30 B layer, 31 B1 compound layer, 32 B2 compound layer, 40 C layer, 50 A layer, $t1_0$ thickness of B1 compound layer, $t2_0$ thickness of B2 compound layer.

The invention claimed is:

1. A surface-coated boron nitride sintered body tool, in which at least a cutting edge portion includes a cubic boron nitride sintered body and a coating film formed on a surface of the cubic boron nitride sintered body, said cubic boron nitride sintered body comprising 30 vol % or more and 80 vol % or less of cubic boron nitride particles, and further comprising a binder phase including at least one compound selected from the group consisting of nitride, carbide, boride, oxide, and solid solutions thereof in group 4 elements, group 5 elements and group 6 elements in a periodic table, an aluminum compound, and inevitable impurities, said coating film including an A layer and a B layer, said A layer including $MLa_{za1}$ (M represents one or more of group 4 elements, group 5 elements and group 6 elements in the periodic table, Al and Si; La represents one or more of B, C, N, and O; and za1 is 0.85 or more and 1.0 or less), said B layer being formed by alternately stacking one or more of each of two or more compound layers having different compositions, said compound layers each having a thickness of 30 nm or more and 300 nm or less, one of said compound layers being a B1 compound layer, said B1 compound layer including $(Ti_{1-xb1-yb1}Si_{xb1}M1_{yb1})(C_{1-zb1}N_{zb1})$ (M1 represents one or more of group 4 elements except for Ti, group 5 elements and group 6 elements in the periodic table, and Al; xb1 is 0.01 or more and 0.25 or less; yb1 is 0 or more and 0.7 or less; and zb1 is 0.4 or more and 1 or less), one of said compound layers being a B2 compound layer, said B2 compound layer being different from said B1 compound layer, and including $(Al_{1-xb2}M2_{xb2})(C_{1-zb2}N_{zb2})$ (M2 represents one or more of group 4 elements, group 5 elements and group 6 elements in the periodic table, and Si; xb2 is 0.2 or more and 0.7 or less; and zb2 is 0.4 or more and 1 or less), t2/t1 that is a ratio between an average thickness t1 of said B1 compound layers and an average thickness t2 of said B2 compound layers satisfying a relation of $0.5<t2/t1\leq10.0$, and said A layer having a thickness of 0.2 µm or more and 10 µm or less, said B layer having a thickness of 0.1 µm or more and 5 µm or less, and said coating film having an entire thickness of 0.5 µm or more and 15 µm or less, and assuming that a thickness of said B1 compound layer is indicated as $t1_0$, a thickness of said B2 compound layer is indicated as $t2_0$, and a thickness ratio between said B1 compound layer and said B2 compound layer that are in contact with each other is indicated as $t2_0/t1_0$, said $t2_0/t1_0$ gradually decreasing from a cubic boron nitride sintered body-side toward an A layer-side, a relation of $1.0<t2_0/t1_0 \leq 5.0$ being satisfied on said cubic boron nitride sintered body-side, and a relation of $0.5<t2_0/t1_0<3.0$ being satisfied on said A layer-side.

2. The surface-coated boron nitride sintered body tool according to claim 1, wherein said A layer includes $(Ti_{1-xa}Ma_{xa})(C_{1-za2}N_{za2})$ (Ma represents one or more of group 4 elements except for Ti, group 5 elements and group 6 elements in the periodic table, Al and Si; xa is 0 or more and 0.7 or less; and za2 is 0 or more and 1 or less).

3. The surface-coated boron nitride sintered body tool according to claim 2, wherein, in said A layer, a composition za2 of N changes in a step-like manner or in a slope-like manner from a cubic boron nitride sintered body-side toward a surface-side of said A layer.

4. The surface-coated boron nitride sintered body tool according to claim 2, wherein said A layer includes, on the surface-side thereof, a region where a composition of C is larger than that on said cubic boron nitride sintered body-side.

5. The surface-coated boron nitride sintered body tool according to claim 1, wherein, in said B2 compound layer, said M2 represents at least one of Ti and Cr, and a composition xb2 of said M2 is 0.25 or more and 0.5 or less.

6. The surface-coated boron nitride sintered body tool according to claim 1, wherein said t2/t1 satisfies a relation of $1.6<t2/t1 \leq 5.0$.

7. The surface-coated boron nitride sintered body tool according to claim 1, wherein an average value of a Si composition in entire said B layer is 0.005 or more and 0.1 or less.

8. The surface-coated boron nitride sintered body tool according to claim 7, wherein the average value of the Si composition in entire said B layer is 0.01 or more and 0.07 or less.

9. The surface-coated boron nitride sintered body tool according to claim 1, wherein said A layer is provided closer to a surface-side of said coating film than said B layer.

10. The surface-coated boron nitride sintered body tool according to claim 1, wherein
said coating film further includes a C layer provided between said A layer and said B layer,
said C layer includes $McLc_{zc}$ (Mc represents one or more of group 4 elements, group 5 elements and group 6 elements in the periodic table, Al and Si; Lc represents one or more of B, C, N, and O; and zc is 0.2 or more and 0.85 or less), and said C layer has a thickness of 0.005 μm or more and 0.5 μm or less.

11. The surface-coated boron nitride sintered body tool according to claim 10, wherein a composition zc of said Lc is 0.2 or more and less than 0.7 in said C layer.

12. The surface-coated boron nitride sintered body tool according to claim 10, wherein said C layer includes at least one or more of elements forming said A layer and said B layer.

13. The surface-coated boron nitride sintered body tool according to claim 1, wherein
said coating film further includes a D layer provided between said cubic boron nitride sintered body and said B layer, and
said D layer includes $MdLd_{zd}$ (Md represents one or more of group 4 elements, group 5 elements and group 6 elements in the periodic table, Al and Si; Ld represents one or more of B, C, N, and O; and zd is 0.85 or more and 1.0 or less).

14. The surface-coated boron nitride sintered body tool according to claim 1, wherein said cubic boron nitride sintered body contains 50 vol % or more and 65 vol % or less of said cubic boron nitride particles.

15. The surface-coated boron nitride sintered body tool according to claim 1, wherein
at an interface between said cubic boron nitride sintered body and said coating film, said cubic boron nitride particles are shaped to protrude more to said coating film than to said binder phase, and
a difference in level between said cubic boron nitride particles and said binder phase is 0.05 μm or more and 1.0 μm or less.

16. The surface-coated boron nitride sintered body tool according to claim 1, wherein said cubic boron nitride particles are increased in volume content from the interface between said cubic boron nitride sintered body and said coating film toward an inside of said cubic boron nitride sintered body.

17. The surface-coated boron nitride sintered body tool according to claim 1, wherein said cubic boron nitride particles are increased in particle size from the interface between said cubic boron nitride sintered body and said coating film toward the inside of said cubic boron nitride sintered body.

* * * * *